United States Patent [19]

Sato et al.

[11] Patent Number: 5,294,516
[45] Date of Patent: Mar. 15, 1994

[54] LIGHT-SENSITIVE TRANSFER MATERIAL

[75] Inventors: Morimasa Sato; Koji Inoue; Masayuki Iwasaki; Fumiaki Shinozaki, all of Kanagawa, Japan

[73] Assignee: Fuji Photo Film Co., Ltd., Kanagawa, Japan

[21] Appl. No.: 903,158

[22] Filed: Jun. 24, 1992

[30] Foreign Application Priority Data

Jun. 25, 1991 [JP] Japan .................... 3-153227
Mar. 23, 1992 [JP] Japan .................... 4-64870

[51] Int. Cl.$^5$ ............................................ G03C 1/805
[52] U.S. Cl. ................................. 430/262; 430/259
[58] Field of Search ............... 430/259, 257, 256, 258, 430/262

[56] References Cited

U.S. PATENT DOCUMENTS

| | | | |
|---|---|---|---|
| 3,458,311 | 7/1969 | Alles | 430/276 |
| 3,884,693 | 5/1975 | Bauer et al. | 430/256 |
| 4,318,975 | 3/1982 | Kuznetsov et al. | 430/260 |
| 4,544,619 | 10/1985 | Christensen et al. | 430/258 |
| 4,559,292 | 12/1985 | Geissler et al. | 430/256 |
| 4,954,390 | 9/1990 | Koshizuka et al. | 428/212 |
| 5,093,168 | 3/1992 | Suzuki et al. | 428/40 |

*Primary Examiner*—Charles L. Bowers, Jr.
*Assistant Examiner*—John A. McPherson
*Attorney, Agent, or Firm*—Sughrue, Mion, Zinn, Macpeak & Seas

[57] ABSTRACT

A light sensitive transfer material comprises a peel-off support, an alkali-soluble thermoplastic resin layer, a water- or aqueous alkali-soluble or -dispersible interlayer having a low oxygen permeability, and a light sensitive resin layer arranged in this order, wherein the adhesion between the peel-off support and the thermoplastic resin layer is the smallest. A process for forming an image using the transfer material is also disclosed.

4 Claims, No Drawings

LIGHT-SENSITIVE TRANSFER MATERIAL

FIELD OF THE INVENTION

The present invention relates to a light-sensitive transfer material adapted to be dry-transferred to an uneven substrate and a process for the formation of an image using such a light-sensitive transfer material.

The light-sensitive transfer material and image formation process according to the present invention are suitable for the preparation of color filters for use in liquid crystal displays and the like or the preparation of printed-wiring boards.

BACKGROUND OF THE INVENTION

An image formation material for transferring a photopolymerizable light-sensitive resin layer to a substrate is known from, e.g., U.S. Pat. No. 3,884,693. This material is used for the preparation of printedwiring board, intaglio printing plate, letterpress printing plate, nameplate, multi-color printed test sample, offset printing plate, screen printing stencil, etc. The transfer material consists of a support, a separation layer, and a photopolymerizable layer. The substrate and the transfer material are laminated with each other in such a manner that the photopolymerizable layer is brought into contact with the substrate. The temporary peel-off support is then peeled off the material. The material is exposed to light through the separation layer, and then developed to form an image on the substrate. In this structure, the separation layer serves to cut off oxygen to facilitate the exposure in air. The thickness of the separation layer is as small as 0.5 $\mu$m to 5 $\mu$m. Therefore, the transfer material has no problem in its resolving power.

However, if there is some unevenness on the substrate, when a very thin photopolymerizable layer is transferred to the substrate, bubbles are confined between the photopolymerizable layer and the substrate, causing poor transfer.

DE 3842028.7 discloses a transfer material comprising an interlayer made of a polyvinyl alcohol derivative interposed between a support and a light-sensitive resin layer. However, this interlayer is intended to improve the peelability of the light-sensitive resin layer from the support and the solubility of the light-sensitive resin layer, and no consideration is given to the transfer properties in the case where there is some unevenness on the substrate.

DE 3706528.9 discloses that if there are some minute irregularities on the permanent support or there are some grains such as minute dust on either or both of the permanent support and the transfer layer, sufficient adhesion of the transfer layer to the permanent support is inhibited, causing poor transfer. As a solution to this problem, DE 3706528.9 proposes that a compressible temporary support be used to improve the adhesion. This approach is certainly effective in some cases. However, it is not effective enough to transfer a non-adhesive light-sensitive resin layer to an uneven permanent support having about the same thickness as the non-adhesive light-sensitive resin layer without generating bubbles.

Japanese Patent Application No. 3-120228 proposes the use of a light-sensitive transfer material which comprises a temporary removable support, particularly a gelatin-undercoated plastic film, a thermoplastic resin layer, a separation layer and a light-sensitive resin layer arranged in this order. This Application also proposes an approach which comprises laminating the light-sensitive resin layer to the support, and then simultaneously peeling and removing the temporary support and the thermoplastic resin layer to transfer the light-sensitive resin layer to the support. However, this approach cannot necessarily provide an easy control over the peeling of the thermoplastic resin layer off the separation layer. Thus, this approach leaves much to be desired from the standpoint of automation of peeling work.

SUMMARY OF THE INVENTION

A first object of the present invention is to provide a light-sensitive transfer material having a layer structure such that the light-sensitive resin layer in the light-sensitive transfer material can be transferred from the temporary peel-off support to the permanent support without causing poor transfer due to minute dust, bubbles, unevenness on the support, etc., sufficient release properties can be provided and exposure in air is enabled.

A second object of the present invention is to provide a light-sensitive transfer material which provides an image free of stain of the substrate.

A third object of the present invention is to provide a light-sensitive transfer material which can inhibit electric shock or dust collection due to electrification of the temporaty peel-off support upon peeling.

A fourth object of the present invention is to provide a process for the formation of an image consisting of pixels and having an excellent flatness.

A fifth object of the present invention is to provide a process for providing a protective layer (OC layer) having an excellent flatness on an image consisting of pixels.

A sixth object of the invention is to provide a process for the formation of an image by a transfer process using the light-sensitive transfer material of the invention.

These and other objects of the present invention will become more apparent from the following detailed description and examples.

The objects of the invention are accomplished with a light-sensitive transfer material comprising a peel-off support having an alkali-soluble thermoplastic resin layer, an interlayer, and a light-sensitive resin layer provided in this order thereon, preferably with the adhesion between said thermoplastic resin layer and said peel-off support being smallest. The objects of the invention are also accomplished by a process for the formation of an image which comprises liminating the light-sensitive resin layer and the permanent support to each other at least under heating and optionally under pressure, peeling the peel-off support off the material at the interface of the thermoplastic resin layer, pattern-wise exposing the light-sensitive resin layer via the thermoplastic resin layer and the interlayer, and then developing the material to form an image on the permanent support.

In a preferred embodiment, the surface electrical resistance of the peel-off support is $10^{13}$ $\Omega$ or less.

In another preferred embodiment, a process for the formation of an image comprises transferring the above-mentioned light-sensitive transfer material to a substrate having an excellent flatness, exposing the material, developing the material to form an image consisting of pixels thereon, and then transferring the image to a permanent support.

In yet another preferred embodiment, a process for the formation of an image which comprises transferring the above-mentioned light-sensitive transfer material to a protective layer provided on a substrate having an excellent flatness, exposing the material, developing the material to form an image consisting of pixels on the protective layer, and then transferring the image together with the protective layer to a permanent support.

DETAILED DESCRIPTION OF THE INVENTION

The present invention is described in detail below.

The temporaty peel-off support in the light-sensitive transfer material of the present invention is preferably composed of a chemically and thermally stable flexible substance that is easily releasable from the thermoplastic resin layer. In particular, a thin sheet of Teflon, polyethylene terepthalate, polycarbonate, polyethylene, polypropylene, etc. or laminate thereof is preferred.

In order to provide excellent release properties, the peel-off support should not be subjected to surface treatments such as glow discharge, nor should it be undercoated with gelatin or the like.

The optimum thickness of the peel-off support is in the range of about 5 $\mu$m to about 300 $\mu$m, preferably about 20 $\mu$m to about 150 $\mu$m.

Under some transfer conditions, the thermoplastic resin of the light-sensitive transfer material may overflow onto the permanent support during transfer, staining the permanent support.

In order to inhibit this phenomenon, it is preferred to use a the thermoplastic resin that is soluble in an aqueous alkali. Thermoplastic resins that are soluble in an aqueous alkali can be easily removed by post-treatments.

The aqueous alkali may be the same as or different from the alkaline developer for the light-sensitive resin of the present invention. The aqueous alkali of the present invention is a dilute solution of an alkaline substance which may contain a small amount of an organic solvent miscible with water. Preferred examples of such alkaline substances include hydroxides of alkali metals (e.g., sodium hydroxide, potassium hydroxide), carbonates of alkali metals (e.g., sodium carbonate, potassium carbonate), bicarbonates of alkali metals (e.g., sodium hydrogencarbonate, potassium hydrogencarbonate), silicates of alkali metals (e.g., sodium silicate, potassium silicate), metasilicates of alkali metals (e.g., sodium metasilicate, potassium metasilicate), triethanolamine, diethanolamine, monoethanolamine, morpholine, tetraalkylammonium hydroxides (e.g., tetramethylammonium hydroxide), and trisodium phosphate. The concentration of the alkaline substance is preferably in the range of about 0.01% by weight to about 30%. The pH value of the aqueous alkali is preferably in the range of about 8 to about 14.

Preferred examples of organic solvents miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, $\epsilon$-caprolactone, $\gamma$-butylolactone, dimethylformamide, dimethylacetamide, hexamethylphosphoramide, ethyl lactate, methyl lactate, $\epsilon$-caprlactam, and N-methylpyrolidone. The concentration of the organic solvent miscible with water is preferably in the range of about 0.1% to about 30% by weight. The organic solvent may further contain a known surface active agent. The concentration of the surface active agent is preferably in the range of about 0.01% to about 10% by weight.

The resin constituting the thermoplastic resin layer preferably exhibits a substantial softening point of about 80° C. or lower.

The alkali-soluble thermoplastic resin having a softening point of about 80° C. or lower preferably includes at least one component selected from the group consisting of saponified products of (meth)acrylic ester copolymers such as saponified products of ethyleneacrylic ester copolymers, saponified products of styrene-(meth)acrylic ester copolymers, saponified products of vinyltoluene-(meth)-acrylic ester copolymers, and poly(meth)acrylic ester, (meth)acrylic butyl and vinyl acetate. Furthermore, among the high molecular weight organic compounds having a softening point of about 80° C. or lower as described in "Plastic Seino Binran (Handbook of Properties of Plastic)", Nihon Plastic Kogyo Renmei, edited by Zennippon Plastic Seikei Kogyo Rengokai, published by Kogyo Chosakai, Oct. 25, 1968, those soluble in an aqueous alkali can be used. High molecular weight organic substances having a softening point of about 80° C. or higher may be used if their substantial softening point is lowered to about 80° C. or less by adding thereto various plasticizers miscible therewith. In order to adjust the adhesion to the peel-off support, various polymers, supercoolants, adhesion modifiers, surface active agents, release agents, or the like can be added to these high molecular weight organic substances to such an extent that their substantial softening point does not exceed about 80° C.

Specific examples of such plasticizers include polypropylene glycol, polyethylene glycol, dioctyl phthalate, diheptyl phthalate, dibutyl phthalate, tricresyl phosphate, cresyl diphenyl phosphate, and biphenyl diphenyl phosphate.

The thickness of the thermoplastic resin layer is preferably in the range of about 6 $\mu$m or more. If the thickness of the thermoplastic resin layer is about 5 $\mu$m or less, it is impossible to fully eliminate the effect of surface imperfections (unevenness) having a size of about 1 $\mu$m or more on the background substrate or permanent support.

The upper limit of the thickness of the thermoplastic resin layer is about 100 $\mu$m or less, preferably about 50 $\mu$m or less to maintain good developability and producibility.

The interlayer material which can be used can be any known material which is dispersible or soluble in water or an aqueous alkali which exhibits a low oxygen permeability. Preberably the interlayer has the oxygen permeability coefficient (P) of from about $0.001 \times 10^{10}$ to about $50 \times 10^{10}$ cm$^2$/sec (30% RH, 25° C.) Examples of such materials include polyvinyl ether-maleic anhydride polymers as disclosed in JP-A-46-2121 (the term "JP-A" as used herein means an "unexamined Japanese patent application") and JP-B-56-40824 (the term "JP-B" as used herein means an "examined Japanese patent publication"), water-soluble salts of carboxyalkyl cellulose, water-soluble cellulose ethers, water-soluble salts of carboxyalkyl starch, polyvinyl alcohols, polyvinyl pyrrolidone, various polyacrylamides, various water-soluble polyamides, water-soluble salts of polyacrylic acid, gelatin, ethylene oxide polymers, water-soluble salts of the group consisting of various starches and their analogues, styrene-maleic acid copolymers, maleate resins, and combinations of two or more kinds of these compounds.

Particularly preferred among these compounds is a combination of polyvinyl alcohol and polyvinyl pyrrolidone. Polyvinyl alcohols having a saponification of about 80% or more are preferred. The content of polyvinyl pyrrolidone is preferably in the range of about 1% to about 75% by weight, more preferably about 1% to about 60% by weight, particularly about 10% to about 50% by weight based on the solid content of the interlayer. If the content of polyvinyl pyrrolidone falls below about 1% by weight, the interlayer cannot obtain sufficient adhesion to the light-sensitive resin layer. If the content of polyvinyl pyrrolidone exceeds about 75% by weight, the interlayer's capacity of cutting off oxygen will deteriorate.

The thickness of the interlayer may be as small as about 0.1 μm to about 5 μm, particularly about 0.5 μm to about 2 μm. If the thickness of the interlayer falls below about 0.1 μm, the interlayer exhibits too high an oxygen permeability. On the other hand, if the thickness of the interlayer exceeds about 5 μm, development or removal of the interlayer takes too much time.

The light-sensitive resin layer is preferably thermoplastic, that is, softens or becomes adhesive at a temperature of about 150° C. or lower. Most of the resins comprising known photopolymerizable compositions exhibit such a property. Some of these known resins can be further modified by adding thereto a thermoplastic binder or a plasticizer miscible therewith.

The material for the light-sensitive resin layer of the present invention there can be used can be any of the light-sensitive resins described in Japanese Patent Application No. 2-82262. Specific examples of such light-sensitive resins include light-sensitive resin compositions made of negative type diazo resins and binders, photopolymerizable compositions, light-sensitive resin compositions made of azide compounds and binders, and cinnamic light-sensitive resin compositions. Particularly preferred among these light-sensitive resins are photopolymerizable resins. These photopolymerizable resins comprise a photopolymerization initiator, a photopolymerizable monomer, and a binder as essential constituents.

Known light-sensitive resins include those developable with an aqueous alkali and those developable with an organic solvent. From the standpoint of inhibition of pollution and worker safety, light-sensitive resins developable with an aqueous alkali are preferred.

The alkaline developer for the light-sensitive resin layer of the present invention is a dilute aqueous solution of an alkaline substance which may further contain a small amount of an organic solvent miscible with water.

Preferred examples of such alkaline substances include hydroxides of alkali metals (e.g., sodium hydroxide, potassium hydroxide), carbonates of alkali metals (e.g., sodium carbonate, potassium carbonate), bicarbonates of alkali metals (e.g., sodium hydrogencarbonate, potassium hydrogencarbonate), silicates of alkali metals (e.g., sodium silicate, potassium silicate), metasilicates of alkali metals (e.g., sodium metasilicate, potassium metasilicate), triethanolamine, diethanolamine, monoethanolamine, morpholine, tetraalkylammonium hydroxides (e.g., tetramethylammonium hydroxide), and trisodium phosphate. The concentration of the alkaline substance is in the range of about 0.01% to about 30% by weight. The pH value of the alkaline developer is preferably in the range of about 8 to about 14.

Preferred examples of organic solvents miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butylolactone, dimethylformamide, dimethylacetamide, hexamethylphosphoramide, ethyl lactate, methyl lactate, ε-caprolactam, and N-methylpyrrolidone. The concentration of the organic solvent miscible with water is in the range of about 0.1% to about 30% by weight. The organic solvent may further contain a known surface active agent. The concentration of the surface active agent is preferably in the range of about 0.01% to about 10% by weight.

The developer may be used in the form of a bath or spray. The removal of the uncured portion from the photopolymerizable light-sensitive layer can be accomplished by rubbing the material with a rotary brush in the developer or rubbing the material with a wet sponge or like method. These methods can be used in combination. The optimum temperature of the developer is normally from room temperature to about 40° C. The development process may be followed by a washing step.

The light-sensitive resin layer may further contain dyes and pigments incorporated therein. All pigment grains should be uniformly dispersed in the light-sensitive resin layer and must preferably have a grain diameter of about 5 μm or less, more preferably about 1 μm or less. In the preparation of a color filter, pigments having a grain diameter of about 0.5 μm or less are preferred.

Preferred examples of dyes or pigments include Victoria Pure Blue BO (C.I.42595), Auramine (C.I.41000), Fast Black HB (C.I.26150), Monolite Yellow GT (C.I. Pigment Yellow 12), Permanent Yellow GR (C.I. Pigment Yellow 17), Permanent Yellow HR (C.I. Pigment Yellow 83), Permanent Carmine FBB (C.I. Pigment Red 146), Hosptaperm Red ESB (C.I. Pigment Violet 19), Permanent Ruby FBH (C.I. Pigment Red 11), Fastel Pink B Supra (C.I. Pigment Red 81), Monastral Fast Blue (C.I. Pigment Blue 15), Monolite Fast Black B (C.I. Pigment Black 1), and carbon. Preferred examples of pigments suitable for the preparation of color filters include C.I. Pigment Red 97, C.I. Pigment Red 122, C.I. Pigment Red 149, C.I. Pigment Red 168, C.I. Pigment Red 177, C.I. Pigment Red 180, C.I. Pigment Red 192, C.I. Pigment Red 215, C.I. Pigment Green 7, C.I. Pigment Green 36, C.I. Pigment Blue 15:1, C.I. Pigment Blue 15:4, C.I. Pigment Blue 15:6, C.I. Pigment Blue 22, C.I. Pigment Blue 60, and C.I. Pigment Blue 64.

It is preferable that a thin coating sheet be provided on the light-sensitive resin layer to protect the light-sensitive resin layer against stain or damage during storage. The coating sheet may be made of the same or similar material as the peel-off support but must be easily separatable from the light-sensitive resin layer. The coating sheet material is preferably silicone paper or polyolefin or polytetrafluoroethylene sheet. The thickness of the coating sheet is preferably in the range of about 5 μm to about 100 μm. A particularly preferred example of such a coating sheet is a polyethylene or polypropylene film having a thickness of about 10 μm to about 30 μm.

The preparation of the light-sensitive transfer material of the present invention can be accomplished by a process which comprises applying a thermoplastic resin solution onto a temporary peel-off support, drying the material to form a thermoplastic resin layer on the peel-off support, coating on the thermoplastic resin layer a solution of an interlayer material in a solvent which does not dissolve the thermoplastic resin layer, drying the material, coating onto the interlayer a solution of a light-sensitive resin layer material in a solvent which does not dissolve the interlayer, and then drying the material.

Alternatively, the preparation of the light-sensitive transfer material of the present invention can be advantageously accomplished by a process which comprises providing a light-sensitive resin layer on a coating sheet, and then laminating this assembly to a second assembly consisting of a second coating sheet having a thermoplastic resin layer and an interlayer coated on the above mentioned peel-off support such that the interlayer and the light-sensitive resin layer are brought into contact with each other. The light-sensitive transfer material of the present invention may also be prepared by a process which comprises preparing a peel-off support having a thermoplastic resin layer thereon and then laminating this assembly to a second assembly consisting of a coating sheet having a light-sensitive resin layer and an interlayer coated thereon such that the light-sensitive resin layer and the interlayer are brought into contact with each other.

When the peel-off support is peeled off the material after the light-sensitive resin layer in the light-sensitive transfer material has been laminated to the permanent support, the film and the human body are charged and may give the operator an electrostatic shock. Furthermore, this electric charge attracts dust from the atmosphere, generating unexposed portions in the subsequent step and possibly causing pinholing.

In the light-sensitive transfer material of the present invention, the peel-off support is preferably provided with an electrically-conductive layer on at least one side thereof that has a surface electrical resistance of about $10^{13}$ Ω or less or the peel-off support itself is designed to be electrically conductive such that it has a surface electrical resistance of about $10^{13}$ Ω or less so as to inhibit electrification.

In order to render the peel-off support electrically conductive, an electrically conductive substance may be incorporated in the peel-off support. For example, finely divided metal oxide grains or an antistatic agent are preferably mixed in the peel-off support. Suitable metal oxides which can be used are finely divided grains of at least one crystalline metal oxide selected from the group consisting of zinc oxide, titanium oxide, tin oxide, aluminum oxide, indium oxide, silicon oxide, magnesium oxide, barium oxide and molybdenum oxide and/or composite oxides thereof. Anionic surface active agents such as alkylphosphates (e.g., Electrostripper A, produced by Kao Soap Co., Ltd., Elenon No. 19, produced by Dai-ich Kogyo Seiyaku Co., Ltd.) amphoteric surface active agents such as betaines (e.g., Amogen, produced by Dai-ichi Kogyo Seiyaku Co., Ltd.) or nonionic surface active agents such as polyoxyethylene aliphatic esters (e.g., Nissan Nonion L, produced by Nippon Oils And Fats Co., Ltd.) and polyoxyethylene alkyl ethers (e.g., Emulgen 106, 120, 147, 420, 220, 905, 910, produced by Kao Soap Co., Ltd., Nissan Nonion E, produced by Nippon Oils And Fats Co., Ltd.). can be used as the antistatic agent. Other examples of nonionic surface active agents include polyoxyethylene alkyl phenol ethers, polyvalent alcohol aliphatic esters, polyoxyethylene sorbitan aliphatic esters, and polyoxyethylene alkyl amines.

In the case where an electrically conductive layer is provided on the peel-off support, the electrically conductive layer may be selected from known electrically conductive substances. In particular, finely devided grains of at least one crystalline metal oxide selected from the group consisting of ZnO, TiO$_2$, SnO$_2$, Al$_2$O$_3$, In$_2$O$_3$, SiO$_2$, MgO, BaO and MoO$_3$ and/or composite oxides thereof are preferably incorporated in the system to provide electrical conductivity insensitive to moisture. The finely divided grains of crystalline metal oxide or composite oxides thereof preferably exhibit a volume resistivity of about $10^7$ Ω.cm or less, particularly about $10^5$ Ω.cm or less.

The finely divided grains of crystallizable metal oxide or composite oxides thereof preferably have a grain size of about 0.01 to about 0.7 μm, particularly about 0.02 to about 0.5 μm.

Processes for the preparation of finely divided grains of electrically conductive crystallizable metal oxids and composite oxides thereof are described in detail in JP-A-56-143430. These processes include a process which comprises calcination to prepare finely divided grains of metal oxide, and then heat treatment of the finely divided grains of metal oxide in the presence of a heteroatom for improving electrical conductivity; a process which comprises calcination in the presence of a heteroatom for improving electrical conductivity to prepare finely divided grains of metal oxide; and a process which comprises calcination in an atmosphere having a reduced oxygen concentration to introduce oxygen defects into the system during the preparation of finely divided metal grains.

Examples of heteroatoms include Al for ZnO, Nb and Ta for TiO$_2$, and Sb, Nb and halogen atoms for SnO$_2$. The amount of such a heteroatom to be incorporated in the system is preferably in the range of about 0.01 to about 30 mol %, particularly about 0.1 to about 10 mol %.

The amount of electrically conductive grains to be used is preferably in the range of about 0.05 g/m$^2$ to about 20 g/m$^2$, particularly about 0.1 g/m$^2$ to about 10 g/m$^2$.

The electrically conductive layer of the present invention can comprise, as a binder gelatin, cellulose esters such as cellulose nitrate, cellulose triacetate, cellulose diacetate, cellulose acetate butyrate and cellulose acetate propionate, homopolymers or copolymers containing vinylidene chloride, vinyl chloride, styrene, acrylonitrile, vinyl acetate, alkyl (C$_{1-4}$ alkyl) acrylate and vinyl pyrrolidone, soluble polyesters, polycarbonates, soluble polyamides or the like. In the dispersion of electrically conductive grains in the binder, a dispersant such as a titanium dispersant or a and silane dispersant may be added to the system. Furthermore, a binder crosslinking agent or the like may be added to the system.

Examples of such titanium dispersants include titanate coupling agents as described in U.S. Pat. Nos. 4,069,192, and 4,080,353, and Plenakt (trade name of a product of Ajinomoto Co., Inc.). Silane dispersants include vinyltrichlorosilane, vinyltriethoxysilane, vinyltris(β-methoxyethoxy)silane, γ-glycidoxypropyltrimethoxysilane, γ-methacryloxypropyl trimethoxy silane, etc. These silane dispersants are commercially available as "silane coupling agents" from The Shin-Etsu Chemical Industry Co., Ltd.

Examples of binder crosslinking agents include epoxy crosslinking agents, isocyanate crosslinking agents, aziridine crosslinking agents, and epoxy crosslinking agents.

A preferred electrically conductive layer of the present invention can be provided by coating on a peel-off support a dispersion of finely divided grains of electrically conductive material i a binder or by coating finely divided grains of electrically conductive material on an undercoated support.

In the case where the electrically conductive layer is provided on the side of the peel-off support opposite the light-sensitive resin layer, a hydrophobic polymer layer is preferably further provided on the electrically conductive layer in order to provide an excellent flaw resistance. In this arrangement, the hydrophobic polymer layer may be coated in the form of a solution in an organic solvent or aqueous latex. The amount of the hydrophobic polymer layer to be coated is preferably in the range of about 0.05 g/m$^2$ to about 1 g/m$^2$ as calculated in terms of dried weight.

Examples of suitable hydrophobic polymers include cellulose esters (e.g., nitrocellulose, cellulose acetate), vinyl polymers such as vinyl chloride, vinylidene chloride and vinyl acrylate, and polymers such as organic solvent-soluble polyamides and polyesters. The hydrophobic polymer layer may comprise a lubricant for providing lubricity, such as the organic carboxylic amide as described in JP-A-55-79435 or a matting agent. The provision of such a hydrophobic polymer layer does not substantially affect the effects of the electrically conductive layer of the present invention.

In the case where a subbing layer is provided, vinylidene chloride copolymers as described in JP-A-51-135526, and U.S. Pat. Nos. 3,143,421, 3,586,508, 2,698,235, and 3,567,452, diolefin copolymers such as butadiene as described in JP-A-51-114120, and U.S. Pat. No. 3,615,556, glycidyl acrylate or glycidyl methacrylate as described in JP-A-51-58469, polyamide epichlorohydrin resins as described in JP-A-48-24923, maleic anhydride-containing copolymers as described in JP-A-50-39536 or the like may be used.

In the present invention, electrically conductive layers as disclosed in JP-A-56-82504, JP-A-56-143443, JP-A-57-104931, JP-A-57-118242, JP-A-58-62647, and JP-A-60-258541 may be used.

In the case where the electrically conductive layer is incorporated in the same plastic material or a different plastic material from the peel-off support film so that it is co-extruded with the peel-off support film, an electrically conductive layer with excellent adhesion and flaw resistance can be easily obtained. In this arrangement, it is not necessary to provide the above mentioned hydrophobic polymer layer or subbing layer. Thus, this arrangement is a particularly preferred embodiment of the electrically conductive layer of the present invention. In the case where the electrically conductive layer is coated, an ordinary method such as roller coating, air knife coating, gravure coating, bar coating and curtain coating may be used.

In order to inhibit electrostatic shock due to electrification of the image formation material of the present invention, it is necessary that the surface electrical resistance of the peel-off support provided with an electrically conductive layer or electric conductivity be about $10^{13}$ Ω or less, particularly about $10^{12}$ Ω or less.

In order to improve the lubricity or inhibit undesirable adhesion of the light-sensitive resin layer to the back side of the peel-off support, it is useful to coat on the back side of the peel-off support a finely divided grain-containing lubricating composition, a silicone compound-containing release agent or the like.

In the case where an electrically conductive layer is provided on the side of the peel-off support opposite the thermoplastic resin layer, the peel-off support may be subjected to surface treatments such as glow discharge, corona discharge and ultraviolet-light irradiation, undercoating with a phenolic substance, polyvinylidene chloride resin, styrene-butadiene rubber, gelatin or the like, or combinations thereof.

The process for forming an image on the light-sensitive transfer material of the present invention is described below.

First, the coating sheet is removed from the light-sensitive resin layer of the light-sensitive transfer material. The light-sensitive resin layer is laminated to a substrate (e.g., a flat plate) at an elevated temperature under pressure. The lamination can be accomplished by the use of a laminator or vacuum laminator. In order to further enhance the producibility, an autocut laminator can be used. Thereafter, the peel-off support is peeled off the material. The light-sensitive transfer material is exposed to light through a predetermined mask, the thermoplastic resin layer and the interlayer, and then developed. The development can be accomplished by any known method such as dipping in a solvent-based or aqueous developer, particularly an alkaline aqueous solution, spraying of developer, brushing with developer and ultrasonic treatment.

By repeating this process several times using a light-sensitive transfer material having differently colored light-sensitive resin layers, a multi-color image can be formed.

If as the above-mentioned substrate a plate substrate having an excellent flatness is used, the surface of the light-sensitive transfer material which has been transferred adheres closely to the substrate, enabling the surface on the substrate side of the finally formed pattern to have the same flatness as the substrate. When this pattern is further transferred to the final support, a pattern with an excellent surface flatness can be obtained. The flatness of the substrate is preferably about $\pm 0.2$ μm or less, more preferably about $\pm 0.1$ μm or less, particularly preferably about $\pm 0.01$ μm or less. Thus, this structure is useful for the preparation of color filters or the like which require very flat surfaces.

On the above-mentioned plate substrate having an excellent flatness, a layer which serves as a protective layer for the final pixel pattern may be provided. The material for this layer must have excellent adhesion to the light-sensitive resin layer and must also be resistant to the developer for the light-sensitive resin layer. More specifically, a compound having the required properties for the protective layer such as impact resistance, chemical resistance and solvent resistance may be selected from the group consisting of materials for adhesion layers as described in JP-A-3-282404. Alternatively, an alkali-soluble compound as described in Japanese Patent Application No. 4-60668 may be printed, coated or transferred onto the above mentioned substrate. A pixel pattern may be formed on this layer by the above mentioned method. In this arrangement, the pixel pattern exists in close contact with the protective layer, often embedded therein. When this pixel pattern is transferred to the final support, an image consisting of a pixel pattern having a protective layer with excellent flatness can be obtained.

A surface-polished aluminum plate, stainless steel plate or the like may be used as the above-mentioned plate substrate with an excellent flatness. The thickness of the substrate is preferably in the range of about 0.1 mm to about 10 mm, particularly about 0.1 mm to about 1 mm.

In the case where a protective layer is provided on the plate substrate, the thickness of the protective layer is in the range of about 10 μm or less, preferably about 5 μm or less, particularly preferably about 3 μm or less. If the thickness of the protective layer exceeds about 10 μm, when the protective layer on which an image has been formed is transferred to the permanent support, the pixels may shift undesirably, disturbing the image.

In addition to the production of printed-wiring boards, the main use of the light-sensitive transfer material of the present invention is the production of multi-color images, particularly color filters for liquid crystal displays or protective layers for color filter.

In the preparation of printed-wiring boards, copper-clad laminate such as epoxy-glass is used as the substrate. In the preparation of color filters, a glass plate, typically soda glass having a silicon oxide film formed thereon or the like, is used as the substrate.

The invention is illustrated in the following examples, but should not be construed as being limited thereto.

EXAMPLE 1

A coating solution having the following formulation H1 was coated on each of four peel-off supports, each consisting of a 100-μm thick polyethylene terephathalate film. The solution was then dried to form a thermoplastic resin layer having a dried thickness of 20 μm on each peel-off support.

| Formulation H1 for thermoplastic resin layer: | |
|---|---|
| Methyl methacrylate/2-ethylhexyl acrylate/benzyl methacrylate/methacrylic acid copolymer (copolymer composition ratio (molar ratio) = 55/28.8/11.7/4.5; weight-average molecular weight: 90,000) | 15 parts by weight |
| Polypropylene glycol diacrylate (average molecular weight: 822) | 6.5 parts by weight |
| Tetraethylene glycol dimethacrylate | 1.5 parts by weight |
| p-Toluenesulfonamide | 0.5 part by weight |
| Benzophenone | 1.0 part by weight |
| Methyl ethyl ketone | 30 parts by weight |

A coating solution having the following formulation B1 was coated on the thermoplastic resin layer on each peel-off support. The solution was then dried to provide an interlayer having a dried thickness of 1.6 μm on the thermoplastic resin layer.

| Formulation B1 for interlayer: | |
|---|---|
| Polyvinyl alcohol (PVA 205, produced by Kuraray Co., Ltd.; percent saponification: 80%) | 130 parts by weight |
| Polyvinyl pyrrolidone (PVP K-90, produced by GAF Corporation) | 60 parts by weight |
| Fluoro surface active agent (Surflon S-131, produced by Asahi Glass Company, Limited) | 10 parts by weight |
| Distilled water | 3,350 parts by weight |

Next, a different color-sensitive solution (black (for Bl layer), red (for R layer), green (for G layer) and blue (for B layer)) was coated on each of the four peel-off supports. The formulations of the respective color-sensitive solutions are set forth in Table 1. The respective solutions were then dried to form a colored light-sensitive resin layer having a dried thickness of 2 μm on each of the peel-off supports.

TABLE 1

Formulations of coating solutions for colored light-sensitive layers

| | R layer (g) | B layer (g) | G layer (g) | Bl layer (g) |
|---|---|---|---|---|
| Benzyl methacrylate/methacrylic acid copolymer (molar ratio = 73/27; viscosity: 0.12) | 60 | 60 | 60 | 60 |
| Pentaerythritol tetraacrylate | 43.2 | 43.2 | 43.2 | 43.2 |
| Michler's ketone | 2.4 | 2.4 | 2.4 | 2.4 |
| 2-(o-Chlorophenyl)-4,5-diphenylimidazole dimer | 2.5 | 2.5 | 2.5 | 2.5 |
| Irgadine Red BPT (red) | 5.4 | — | — | — |
| Sudan Blue (blue) | — | 5.2 | — | — |
| Copper phthalocyanine (green) | — | — | 5.6 | — |
| Carbon black (black) | — | — | — | 5.6 |
| Methyl cellosolve acetate | 560 | 560 | 560 | 560 |
| Methyl ethyl ketone | 280 | 280 | 280 | 280 |

A 12-μm thick coating sheet made of polypropylene was contact-bonded to each of these light-sensitive resin layers to prepare red-, blue-, green-and black-sensitive transfer materials.

With these light-sensitive transfer materials, a color filter was prepared in the following manner.

The coating sheet was peeled off the red-sensitive transfer material. The red-sensitive transfer material was then laminated to a 1.1-mm thick transparent glass substrate by means of a laminator (VP-II, produced by Taisei Laminator K.K.) at an elevated temperature of 130° C. under a pressure of 0.8 kg/cm$^2$ such that the light-sensitive resin layer was brought into contact with the glass substrate. Subsequently, the peel-off support was peeled off the material at the interface of the thermoplastic resin layer to remove the peel-off support.

The material was then exposed to light through a photomask. The thermoplastic resin layer and the interlayer were removed with a 1% aqueous solution of triethanolamine. It was found that the light-sensitive resin layer had not been substantially developed. The light-sensitive resin layer was then developed with a 1% aqueous solution of sodium carbonate. Unexposed portions were then removed to form a red pixel pattern on the glass substrate.

The green-sensitive transfer material was then laminated onto the glass substrate on which the red pixel pattern had been formed in the same manner as described above. Peeling, exposure and development were carried out to form a green pixel pattern.

Similar processes were repeated for the blue-sensitive transfer material and the black-sensitive transfer material to form a color filter on the transparent glass substrate.

In these steps, the peel-off support exhibited a sufficient peelability from the thermoplastic resin layers. The resulting color filter showed no pixel loss and had excellent adhesion to the substrate and no stain.

COMPARATIVE EXAMPLE 1

Red-sensitive, green-sensitive, blue-sensitive and black-sensitive transfer materials were prepared in the same manner as in Example 1 except that the interlayer and light-sensitive resin layer as used in Example 1 were provided on the polyethylene terephthalate film without providing the thermoplastic resin layer as used in Example 1 on the 100-μm thick PET peel-off support.

The various color-sensitive transfer materials were laminated in the same manner as in Example 1. Exposure and development were carried out to prepare a color filter on the transparent glass substrate. In this case, bubbles were left during the lamination of the second and subsequent color layers. The resulting color filter showed pixel loss. Also, there were bubbles left in some pixels, causing poor adhesion to the substrate.

EXAMPLE 2

A thermoplastic resin layer having the same formulation as used in Example 1 was coated on a 20-μm thick polyethylene terephthalate film and dried to a thickness of 10 μm in the same manner as in Example 1. An interlayer having the same formulation as used in Example 1 was coated on the thermoplastic resin layer to a dry thickness of 1.5 μm.

A light-sensitive resin layer coating solution having the formulation set forth below was coated on the interlayer. The solution was then dried to form a 20-μm thick photoresist layer on the interlayer.

| Formulation of light-sensitive resin layer: | |
|---|---|
| Methyl methacrylate/2-ethylhexyl acrylate/benzyl methacrylate/methacrylic acid copolymer (copolymer composition ratio (molar ratio) = 55/28.8/11.7/4.5; weight-average molecular weight: 90,000) | 15 parts by weight |
| Polypropylene glycol diacrylate (Average molecular weight: 822) | 6.5 parts by weight |
| Tetraethylene glycol dimethacrylate | 1.5 parts by weight |
| p-Toluenesulfonamide | 0.5 part by weight |
| 1,4-Bis(N,N-diethylamino)benzophenone | 0.04 part by weight |
| Benzophenone | 1.0 part by weight |
| Oxalate of Malachite Green | 0.02 part by weight |
| 3-Morpholinomethyl-1-phenyl-triazole-2-thione | 0.01 part by weight |
| Leucocrystal Violet | 0.2 part by weight |
| Tribromomethyl phenyl sulfone | 0.1 part by weight |
| Methyl ethyl ketone | 30 parts by weight |

Finally, a 20-μm thick polyethylene film material was laminated onto the thus formed photoresist layer to prepare a dry film photoresist.

The dry film photoresist material from which the polyethylene film had been removed was laminated onto a flattened copper-clad epoxy-glass substrate by means of a heat roll laminator while the photoresist layer was brought into close contact with the copper-clad epoxy-glass substrate to prevent bubbles from entering into the gap therebetween.

The polyethylene terephthalate film was then peeled off and removed from the surface of the material. The polyethylene terephthalate film showed an excellent peelability. Using a printer made by Oak Inc., the material was then exposed to ultraviolet light through a circuit pattern photomask. The material was developed with a spray of a 1% aqueous solution of sodium carbonate to form an etching resist having a circuit pattern on the copper-clad epoxy-glass substrate. Thus, a resist image of a circuit pattern having an extremely high resolution and free of defects such as peeling was obtained.

The material was then sprayed with a cupric chloride etchant so that the copper portion which had not been covered by the etching resist was dissolved away. The remaining etching resist was then removed by a spray of a 2% aqueous solution of sodium hydroxide. Thus, a copper printed circuit having a high resolution and a high precision was formed on the epoxy-glass substrate.

COMPARATIVE EXAMPLE 2

A light-sensitive transfer material was prepared in the same manner as in Example 2 except that the thermoplastic resin layer was omitted. Using this light-sensitive transfer material, a resist pattern was formed on a smoothened copper-clad epoxy-glass substrate in the same manner as in Example 2. A pattern image was obtained, but it showed poor adhesion to the substrate at many points and was of no practical use.

EXAMPLE 3

A multi-color image was formed in the same manner as in Example 1 except that the dry thickness of the thermoplastic resin layer was 15 μm. No bubbles were observed after the transfer of the various color layers. The resulting multi-color image had no defects. A pinhole-free multi-color image was formed on the glass plate.

EXAMPLE 4

A thermoplastic resin layer of the same composition set forth in Example 1 was coated onto a 20-μm thick polyethylene terephthalate film to a dried thickness of 10 μm. An interlayer of the same composition set forth in Example 1 was coated onto the thermoplastic resin layer to a dry thickness of 1.5 μm.

A light-sensitive resin layer coating solution having the following formulation was coated onto the interlayer. The solution was then dried to form a 10-μm thick photoresist layer on the interlayer.

| Composition of light-sensitive resin layer coating solution | |
|---|---|
| Methyl methacrylate/2-ethylhexyl acrylate/benzyl methacrylate/methacrylic acid copolymer (copolymer composition ratio (molar ratio) = 55/28.8/11.7/4.5; weight-average molecular weight: 90,000) | 15 parts by weight |
| Polypropylene glycol diacrylate (average molecular weight: 822) | 6.5 parts by weight |
| Tetraethylene glycol dimethacrylate | 1.5 parts by weight |
| p-Toluenesulfonamide | 0.5 part by weight |
| 1,4-Bis(N,N-diethylamino)benzophenone | 0.04 part by weight |
| Benzophenone | 1.0 part by weight |
| Oxalate of Malachite Green | 0.02 part by weight |
| 3-Morpholinomethyl-1-phenyl-triazole-2-thione | 0.01 part by weight |
| Leucocrystal Violet | 0.2 part by weight |
| Tribromomethyl phenyl sulfone | 0.1 part by weight |
| Methyl ethyl ketone | 30 parts by weight |

Finally, a 20-μm thick polyethylene film material was laminated onto the thus-formed photoresist layer to prepare a dry film photoresist.

The dry film photoresist material from which the polyethylene film had been removed was laminated onto a flattened copper-clad epoxy-glass substrate by means of a heat roll laminator while the photoresist layer was brought into close contact with the copper-clad epoxy-glass substrate to prevent bubbles from entering into the gap therebetween.

The polyethylene terephthalate film was then peeled off and removed from the surface of the material. The polyethylene terephthalate film showed an excellent peelability. Using a printer made by Oak Inc., the material was then exposed to ultraviolet light through a a circuit pattern photomask. The material was developed with a spray of a 1% aqueous solution of sodium carbonate to form an etching resist having a circuit pattern on the copper-clad epoxy-glass substrate. Thus, a resist image of a circuit pattern was formed on the copper-clad epoxy-glass substrate.

No oozing of thermoplastic resin to the periphery of the substrate was observed. A resist image of a circuit pattern having an extremely high resolution and free of defects such as peeling was obtained.

The material was then sprayed with a cupric chloride etchant so that the copper portion which had not been covered by the etching resist was dissolved away. The remaining etching resist was then removed by a spray of a 2% aqueous solution of sodium hydroxide. Thus, a copper printed circuit having a high resolution and a high precision was formed on the epoxy-glass substrate.

COMPARATIVE EXAMPLE 3

The procedure of Exmaple 1 was repeated except that thermoplastic resin composition having the following formulation was used instead of the formulation used in Example 1.

| | |
|---|---|
| Dianal BR85 (acrylic resin produced by Mitsubishi Rayon Company Limited; weight-average molecular weight: 250,000) | 1.8 parts by weight |
| Dianal BR77 (acrylic resin produced by Mitsubishi Rayon Company Limited; weight-average molecular weight: 80,000) | 1.2 parts by weight |
| Trimethylol propane triacrylate | 1.22 parts by weight |
| Tetraethylene glycol diacrylate | 0.5 part by weight |
| p-Toluenesulfonamide | 0.32 part by weight |
| Benzophenone | 0.008 part by weight |
| Methyl ethyl ketone | 12.6 parts by weight |

A multi-color image was formed in the same manner as in Example 1. However, the thermoplastic resin oozed and stained the roll in the laminator at the time of transfer, causing staining on the glass substrate in the subsequent transfer process. Further, since the thermoplastic resin layer having this formulation was not alkali-soluble, it could not be developed and removed with an alkaline aqueous solution.

COMPARATIVE EXAMPLE 4

A light-sensitive transfer material was prepared in the same manner as in Example 2 except that the same thermoplastic resin layer as used in Comparative Example 3 was employed. Using this light-sensitive transfer material, a resist pattern was formed on a flattened copper-clad epoxy-glass substrate as in Exmaple 3. A fine image was obtained, but oozing of the thermoplastic resin to the periphery of the image portion was observed. The material was etched, but the copper under the remaining thermoplastic resin was left nonetched.

COMPARATIVE EXAMPLE 5

Light-sensitive transfer materials were prepared in the same manner as in Example 1 except that the interlayer was prepared using the following formulation free of polyvinyl pyrrolidone.

| | |
|---|---|
| Polyvinyl alcohol (PVA 205, produced by Kuraray Co., Ltd.; percent saponification: 80%) | 190 parts by weight |
| Fluoro surface active agent (Surflon S-131, produced by Asahi Glass Company, Limited) | 10 parts by weight |
| Distilled water | 3,350 parts by weight |

Thus, red-sensitive, blue-sensitive, green-sensitive and black-sensitive transfer materials were prepared.

The cover film was peeled off the red-sensitive transfer material. The red-sensitive transfer material was then laminated to a 1.1-mm thick transparent glass substrate at an elevated temperature of 130° C. under a pressure of 0.8 kg/cm$^2$ by means of a laminator (VP-II, produced by Taisei Laminator K.K.) such that the light-sensitive resin layer was brought into contact with the glass substrate. Subsequently, in order to remove the peel-off support, an attempt was made to peel the peel-off support off the material at the interface of the thermoplastic resin layer. However, the peel-off support could not be peeled off at this interface. Peeling occured partially at the interface between the red-sensitive resin layer and the interlayer.

At the portion on the transparent glass substrate which had lost the interlayer, the red-sensitive resin layer was affected by oxygen and showed a remarkable drop in sensitivity.

EXAMPLES 6 TO 11

Samples (a) to (f) were prepared by providing electrically conductive layers having different surface resistivities on one side of 100-μm thick polyethylene terephthalate films, respectively, in accordance with the following methods.

Preparation of Sample (a)

65 parts by weight of hydrous stannic chloride and 1.5 parts by weight of antimony trichloride were dissolved in 1,000 parts by weight of ethanol to obtain a uniform solution. To this solution was added dropwise a 1N aqueous solution of sodium hydroxide until the pH value thereof reached 3. A colloidal coprecipitate of stannic chloride and antimony oxide formed was allowed to stand at a temperature of 50° C. for 24 hours to obtain a reddish brown colloidal precipitate.

This precipitate was then subjected to centrifugal separation. In order to remove excess ions, water was added to the precipitate, and the mixture was then washed with water by centrifugal separation. This procedure was repeated three times to remove excess ions therefrom.

100 parts by weight of the precipitate were mixed with 1,000 parts by weight of water. The mixture was sprayed into a calcining furnace which had been heated to a temperature of 650° C. to obtain bluish finely divided grains of an electrically conductive substance having an average grain diameter of 0.15 μm.

The finely divided grains of electrically conductive substance were subjected to dispersion in the following formulation by means of a paint shaker (produced by Toyo Seizai Seisakusho K.K.) for 5 hours.

| | |
|---|---|
| The above-mentioned finely divided grains of electrically conductive substance | 200 parts by weight |
| Salan F-310 (vinylidene chloride | 10 parts by weight |

-continued

| | |
|---|---|
| copolymer produced by Asahi Dow K.K.) | |
| Methyl ethyl ketone | 150 parts by weight |

Using this dispersion, a coating solution having the following formulation was prepared. This coating solution was coated onto a 100-μm thick polyethylene terephthalate film in such an amount that the dried coated amount was 1.3 g/m². The material was then dried at a temperature of 130° C. for 2 minutes.

| | |
|---|---|
| The above mentioned dispersion | 15 parts by weight |
| Salan F-310 | 3 parts by weight |
| Methyl ethyl ketone | 100 parts by weight |
| Cyclohexanone | 20 parts by weight |
| m-Cresol | 5 parts by weight |

A solution having the following formulation was coated onto this layer in such an amount that the dried coated amount was 0.2 g/m². The material was then dried at a temperature of 130° C. for 1 minute.

| | |
|---|---|
| Cellulose triacetate | 1 part by weight |
| Methylene dichloride | 60 parts by weight |
| Ethylene dichloride | 40 parts by weight |
| Erucamide | 0.01 part by weight |

Sample (a) thus obtained was then measured for surface electric resistance by means of an insulation resistance meter (VE-30, produced by Kawaguchi Denkyoku K.K.). The resistance was $7 \times 10^8$ Ω at a temperature of 25° C. and 25% RH.

Preparation of Samples (b) to (f)

Samples (b) to (f) were prepared by altering the added amount of the above-mentioned finely divided grains of electrically conductive substance. The electrical resistances of these specimens are set forth in Table 2.

TABLE 2

| | |
|---|---|
| Sample (b) | $10^{10}$ Ω |
| Sample (c) | $10^{11}$ Ω |
| Sample (d) | $10^{12}$ Ω |
| Sample (e) | $10^{13}$ Ω |
| Sample (f) | $10^{9}$ Ω |

These samples (a) to (f) were used as peel-off supports and the same thermoplastic resin layer, interlayer and light-sensitive resin layer as used in Example 4 were coated on the side of each support opposite the electrically conductive layer.

A 12-μm thick polypropylene cover film was contact-bonded onto each light-sensitive resin layer to prepare red-sensitive, blue-sensitive, green-sensitive and black-sensitive transfer materials.

Using these light-sensitive transfer materials, a color filter was obtained in the same manner as in Example 1. The resulting color filters showed no pixel loss and had a good adhesion to the substrate.. Furthermore, no electrostatic shock was felt upon peeling of the peel-off support.

COMPARATIVE EXAMPLE 6

A light-sensitive material was prepared in the same manner as in Example 6 except that a 100-μm thick untreated polyethylene terephthalate film was used as the peel-away support. Using this light-sensitive transfer material, a color filter was prepared in the same manner as in Example 1. When the peel-off support was peeled off the material, a strong electric shock was felt. The resulting color filter showed pinholes in pixels due to the attachment of dust.

COMPARATIVE EXAMPLE 7

Sample (g) was prepared in the same manner as Sample (a) in Example 6 except that the added amount of electrically conductive grains was reduced so that the surface electric resistance was $10^{14}$ Ω. Using this sample, a light-sensitive transfer material was prepared in the same manner as in Example 6. Using this light-sensitive transfer material, a color filter was prepared in the same manner as in Example 1. When the peel-off support was peeled off the thermoplastic resin layer, a strong electric shock was felt. The resulting color filter showed pinholes in pixels due to the attachment of dust.

COMPARATIVE EXAMPLE 8

A thermoplastic resin layer of the some composition used in Example 1 was coated onto a 100-μm thick PET film to a thickness of 5 μm. An interlayer and a light-sensitive resin layer of the some composition used in Example 1 were coated onto the thermoplastic resin layer in this order to prepare red-sensitive, green-sensitive, blue-sensitive and black-sensitive transfer materials.

The various color-sensitive transfer materials were laminated in the same manner as in Example 1. Exposure and development were repeated to form a color filter on a transparent glass substrate. In this case, bubbles were left during the lamination of the second and subsequent color layers. The resulting color filter showed pixel loss. There were bubbles left in some pixels, causing poor adhesion to the substrate.

COMPARATIVE EXAMPLE 9

A light-sensitive transfer material was prepared in the same manner as in Example 2 except that the thickness of the thermoplastic resin layer was changed to 5 μm. Using this light-sensitive transfer material, a resist pattern was formed on a smoothened copper-clad epoxy-glass substrate in the same manner as in Example 2. A pattern image was obtained, but it showed poor adhesion to the substrate at many points and was of no practical use.

EXAMPLE 12

Light-sensitive transfer materials were prepared in the same manner as in Example 1 except that a 100-μm thick polyethylene terepthalate film was used as a peel-off support.

Among these color-sensitive transfer materials, the red-sensitive transfer material was then laminated to a 1.0-μm thick mirror-polished aluminum plate (flatness: ±0.01 μm) at a roller temperature of 105° C. and a laminating rate of 0.9 m/min. under a pressure of 2 kg/mm² by means of a laminator (VP-II, produced by Taisei Laminator K.K.) such that the light-sensitive resin layer was brought into contact with the aluminum plate.

A color filter was then formed on the aluminum plate in the same manner as in Example 1.

An adhesion layer having the following formulation was coated on a 100-μm thick polyethylene terephthalate film to a thickness of 1 μm and then dried to form an adhesion layer film.

| Coating solution for adhesion layer: | |
|---|---|
| Methyl ethyl ketone | 2,600 g |
| Dianal BR-77 (acrylic resin produced by Mitsubishi Rayon Company Limited) | 168 g |
| Dianal BR-64 (acrylic resin produced by Mitsubishi Rayon Company Limited) | 168 g |
| Oxilack SH-101 (styrene-maleic monopropylester copolymer produced by Nippon Shokubai Kagaku Kogyo Co., Ltd.) | 59 g |
| NK ester TMMT (pentaerythritol tetraacrylate produced by Shinnakamura Kagaku K.K.) | 216 g |
| Megafac F-177P (fluoro surface active agent produced by Dainippon Ink And Chemicals, Incorporated) | 3.8 g |
| Hydroquinone monomethyl ether | 0.5 g |
| Irgacure 651 (dimethoxyphenyl acetophenone produced by Ciba Geigy) | 15 g |
| Silane coupling agent (KBM-403, γ-glycidoxypropyl trimethoxy silane produced by The Shin-Etsu Chemical Industry Co., Ltd.) | 2.5 g |

This adhesion layer film was then laminated to a 1.1-mm thick glass substrate. The polyethylene film was then peeled off the material to transfer the adhesion layer to the glass substrate. The transfer conditions were the same as mentioned above.

The glass substrate and the aluminum plate were laminated with each other such that the adhesion layer was brought into contact with the color filter. The aluminum substrate was then peeled and removed away to form a color filter on the glass substrate.

The color filter thus obtained exhibited the same surface flatness as the aluminum plate peel-off substrate (±0.1 μm). ITO was then sputtered directly onto this color filter without any flattening layer provided thereon to form an oriented film. Thus, a liquid crystal display cell was assembled. No opposed short circuits occurred.

EXAMPLE 13

The same adhesion layer coating solution used in Example 12 was coated onto an aluminum plate to a dry thickness of 3 μm to prepare a protective layer.

A color filter with a protective layer was formed on a glass substrate in the same manner as in Example 12.

The same excellent results as obtained in Example 12 were obtained.

As described above, the light-sensitive transfer material of the present invention comprises the light-sensitive resin layer to be transferred and a thermoplastic resin layer interposed between the interlayer and peel-off, support, enabling the transfer of the light-sensitive resin layer leaving no bubbles even if there is some unevenness on the substrate. Thus, a monochromatic or multi-color pattern with an excellent quality can be formed by a simple process.

In the light-sensitive transfer material of the present invention, the thermoplastic resin layer is alkali-soluble and can be easily removed by subsequent treatments, causing no stain on the substrate.

By rendering the peel-off support electrically conductive to give a surface electic resistance of $10^{13}$ Ω or less, no electic shock results when the material is handled. No failures due to the attachment of dust occur.

Furthermore, by forming a color filter directly on a substrate having an excellent flatness or via a protective layer and then transferring the color filter to the final support, a color filter having an excellent surface flatness can be obtained.

While the invention has been described in detail and with reference to specific embodiments thereof, it will be apparent to one skilled in the art that various changes and modifications can be made therein without departing from the spirit and scope thereof.

What is claimed is:

1. A light-sensitive transfer material, comprising a peel-off support and an alkali-soluble thermoplastic resin layer having a thickness of 6 μm to about 100 μm, a water or aqueous alkali-soluble or dispersible interlayer having a low oxygen permeability, and a light sensitive resin layer arranged in the order of increasing distance from the peel-off support, wherein the adhesion between the peel-off support and the thermoplastic resin layer is the smallest.

2. The light-sensitive transfer material of claim 1, wherein the interlayer comprises 1 to 75% by weight polyvinyl pyrrolidone based on the solids content of the interlayer.

3. The light-sensitive transfer material of claim 1, wherein the peel-off support has a surface electric resistance of $10^{13}$ Ω or less.

4. The light-sensitive transfer material of claim 1, wherein an electrically conductive layer having a surface electric resistance of $10^{13}$ Ω or less is provided on at least one side of the peel-off support.

* * * * *